(12) United States Patent
Hou et al.

(10) Patent No.: US 8,557,006 B2
(45) Date of Patent: Oct. 15, 2013

(54) CHEMICAL MECHANICAL POLISHING SLURRY, ITS PREPARATION METHOD AND USE FOR THE SAME

(75) Inventors: Hui-Fang Hou, Kaohsiung County (TW); Wen-Cheng Liu, Kaohsiung County (TW); Yen-Liang Chen, Kaohsiung County (TW); Jui-Ching Chen, Kaohsiung County (TW)

(73) Assignee: Epoch Material Co., Ltd., Aurora, IL (US)

( * ) Notice: Subject to any disclaimer, the term of this patent is extended or adjusted under 35 U.S.C. 154(b) by 0 days.

(21) Appl. No.: 13/456,413

(22) Filed: Apr. 26, 2012

(65) Prior Publication Data
US 2012/0270401 A1 Oct. 25, 2012

Related U.S. Application Data

(62) Division of application No. 11/892,720, filed on Aug. 27, 2007, now Pat. No. 8,167,684.

(30) Foreign Application Priority Data

Oct. 24, 2006 (TW) .............................. 95139197 A

(51) Int. Cl.
*C09G 1/02* (2006.01)
*H01L 21/31053* (2006.01)

(52) U.S. Cl.
USPC ............................................ 51/308; 438/692

(58) Field of Classification Search
USPC ............. 451/36, 59, 308; 51/307–309; 106/3; 438/690–692; 252/79.1
See application file for complete search history.

(56) References Cited

U.S. PATENT DOCUMENTS

| | | | |
|---|---|---|---|
| 5,221,497 A * | 6/1993 | Watanabe et al. | 516/83 |
| 7,153,335 B2 * | 12/2006 | Siddiqui et al. | 51/307 |
| 2003/0157804 A1 * | 8/2003 | Puppe et al. | 438/692 |
| 2006/0157671 A1 * | 7/2006 | Park et al. | 252/79.1 |

* cited by examiner

*Primary Examiner* — Pegah Parvini
(74) *Attorney, Agent, or Firm* — Thomas E Omholt; Steven D Weseman

(57) ABSTRACT

A chemical mechanical polishing slurry for polishing a copper layer without excessively or destructively polishing a barrier layer beneath the copper layer is disclosed and includes an acid, a surfactant, and a silica sol having silica polishing particles that are surface modified with a surface charge modifier and that have potassium ions attached thereto. A method for preparing the chemical mechanical polishing slurry and a chemical mechanical polishing method using the chemical mechanical polishing slurry are also disclosed.

5 Claims, 3 Drawing Sheets

CHEMICAL MECHANICAL POLISHING SLURRY, ITS PREPARATION METHOD AND USE FOR THE SAME

CROSS-REFERENCE TO RELATED APPLICATION

This application is a divisional of U.S. patent application Ser. No. 11/892,720, filed on Aug. 27, 2007, now U.S. Pat. No. 8,167,684; which in turn claims priority of Taiwanese Application No. 095139197, filed on Oct. 24, 2006.

BACKGROUND OF THE INVENTION

1. Field of the Invention

The invention relates to a chemical mechanical polishing slurry, more particularly to a chemical mechanical polishing slurry for polishing a copper layer without excessively or destructively polishing a barrier layer beneath the copper layer. The invention also relates to a method for preparing the chemical mechanical polishing slurry, and a chemical mechanical polishing method using the chemical mechanical polishing slurry.

2. Description of the Related Art

Chemical mechanical planarization is an essential technology in a semiconductor manufacturing process, and may affect the result of the following photolithography. The planarization requirement for a surface of a wafer is more stringent due to the fact that the diameter of the wafer is increased, the wire width of the manufacturing process is miniaturized, and the integrated density of the components is increased. A chemical mechanical polishing (hereinafter referred to as CMP) process is used for the planarization of the surface of the wafer. An advantage of the CMP process is that it can solve the problem in which the focus depth is reduced due to the lithography miniaturization during the photolithography process for fabricating wafers having highly densified integrated circuits.

A copper chemical mechanical polishing (hereinafter referred to as Cu CMP) process is a two-step polishing process for the planarization of the surface of the wafer. Copper on the surface of the wafer is removed in the first step so as to expose a barrier layer, which is primarily composed of tantalum nitride or tantalum. The barrier layer is then removed in the second step. Each of the two steps is performed using a specific polishing slurry. The polishing slurry for the first step should meet the requirements that the surface of the wafer should be as planar as possible (i.e., the dishing and erosion levels should be as low as possible), and that the polishing slurry should not cause damage to the barrier layer while achieving a high rate of copper removal.

A typical slurry for the Cu CMP process is composed of an acid or base solution, which includes an acid or base component, water, surfactant, etc., and solid polishing particles dispersed in the solution. The acid or base solution is used to react with the copper on the surface of the wafer to form a copper oxide passivated film, which can be abraded mechanically by the polishing particles.

The polishing particles may be silica, alumina, zirconia, cerium oxide, silicon carbide, titania, silicon nitride, or combinations thereof.

Taiwanese Patent No. 1235762 discloses a slurry for polishing copper-based metal comprising a silica polishing material, an oxidant, amino acid, a triazole compound, and water, wherein the weight ratio of the amino acid to the triazole compound ranges from 5 to 8, and wherein the triazole compound is selected from the group consisting of 1,2, 3-triazole, 1,2,4-triazole, and the derivatives thereof. The silica polishing material is silica polishing particles commonly used in the art.

Colloidal silica particles commonly used as polishing particles are made by a wet chemical method which includes the steps of preparing a dilute solution of a water glass (e.g., sodium water glass and potassium water glass which are primarily composed of sodium silicate and potassium silicate, respectively) solution; passing the water glass solution through a cationic exchange resin to remove metallic ions such as $Na^+$ and $K^+$ from the water glass solution to form an aqueous active silicic acid solution; adding a basic agent to the silicic acid solution for alkalization at appropriate temperature and pH value to conduct polycondensation of active silicic acid to form particles of colloidal silica; and ultra-filtering the particles of colloidal silica to obtain a silica sol. In consideration of safety, operating convenience, and production costs, the alkalization is usually conducted using sodium hydroxide or sodium water glass.

Since the colloidal silica particles bear negative charge on the surfaces thereof, they cannot be used advantageously in an acidic polishing slurry for the first step of the Cu CMP process to remove Cu. It is well known in the art to treat the colloidal silica particles with a surface charge modifier to cationically modify the surface of the colloidal silica particles. The details of the treatment with the surface charge modifier are described in "The Chemistry of Silica", R. K. Iler, Wiley Interscience (1979), pp. 410-441. For example, in the wet chemical method for preparing the colloidal silica particles, the salt of a metal, such as aluminum, chromium, gallium, titanium or zirconium, (e.g., sodium aluminate, or aluminium hydroxychloride can be used as the surface charge modifier. The metallic cationic ions from the surface charge modifier bonded onto the surfaces of the colloidal silica particles modify the surface charge of the colloidal silica particles so that the colloidal silica particles can be used stably in an acidic polishing slurry useable for the first step of the Cu CMP process to remove Cu. U.S. Pat. No. 5,368,833 discloses a silica sol comprising silica particles having a specific surface area within a range from 750 to 1000 $m^2/g$ and surface-modified with aluminum to a degree of from 2 to 25% substitution of silicon atoms. The sol has an S-value within the range from 8 to 45%. It is disclosed in the patent that the sols are particularly suitable for use as additives in paper making, and that the process disclosed therein is suitable for the production of sols having a comparatively broad particle size distribution.

The process for the production of silica sols disclosed in the aforesaid U.S. patent starts from an alkali water glass (preferably, sodium water glass). A water glass solution prepared from the alkali water glass is acidified and then alkalized to form silica particles, which are further processed by a cationic exchange resin treatment and a surface modification of the surfaces of the silica particles to obtain the desirable silica sols. In Column 3, Lines 9-11 of U.S. Pat. No. 5,368,833, it is described that the alkalization can be carried out with conventional alkali such as sodium, potassium or ammonium hydroxide, that it is preferred that alkalization is carried out by addition of water glass, and that potassium and sodium water glass, particularly sodium water glass, with a specific mole ratio of $SiO_2$ to $M_2O$, is used in the alkalization.

Since polishing particles used in a CMP slurry must have a relatively homogeneous particle distribution to achieve a superior polishing result, the sols having a comparatively broad particle size distribution as disclosed in U.S. Pat. No.

5,368,833 are not suitable for a CMP process. Moreover, such patent suggests nothing relating to a polishing slurry suitable for a CMP process.

U.S. Pat. No. 6,362,108 discloses a composition for chemical mechanical polishing comprising an acid aqueous suspension of cationized colloidal silica containing individualized colloidal silica particles and water as the suspension medium. The composition is used for polishing a layer of insulating material based on a polymer with a low dielectric constant. However, copper removal is neither taught nor suggested in this patent.

U.S. Patent Application Publication No. 2003/0094593 A1 discloses a silica and a slurry composition for chemical mechanical planarization. The silica comprises an aggregate of primary particles having an average diameter of at least 7 nanometers, and a hydroxyl content of at least 7 hydroxyl groups per nanometer squared. The slurry composition comprises the silica, and is used for the chemical mechanical planarization of a substrate such as micro-electronic substrate by removing copper, tantalum, and silicon dioxide from the substrate.

As recited in claim 17 of US Pat. Publ. No. 2003/0094593 publication, the removal of tantalum is at a rate which is equal to or greater than the removal rate of copper. Therefore, the slurry composition disclosed in this prior art is suitable for removing tantalum, rather than copper. That is, the slurry composition is suitable for the second step of a Cu CMP process for the removal of a barrier layer, rather than the first step of the Cu CMP process for the removal of copper.

Therefore, it is desirable to provide a chemical mechanical polishing slurry for the removal of copper which will not cause damage to a barrier layer beneath a copper layer while providing a high efficiency for copper removal.

SUMMARY OF THE INVENTION

One object of the present invention is to provide a chemical mechanical polishing slurry, which can remove a copper layer on a wafer efficiently and which does not cause substantial damage to a barrier layer beneath the copper layer.

Another object of the present invention is to provide a chemical mechanical polishing method which uses the chemical mechanical polishing slurry.

A further object of this invention is to provide a method for making the chemical mechanical polishing slurry.

In the first aspect of this invention, the chemical mechanical polishing slurry for polishing a copper layer without excessively or destructively polishing a barrier layer beneath the copper layer according to this invention includes an acid, a surfactant, and a silica sol having silica polishing particles that are surface modified with a surface charge modifier and that have potassium ions attached thereto.

In the second aspect of this invention, the chemical mechanical polishing method according to this invention includes the steps of contacting a wafer with a polishing pad; supplying a chemical mechanical polishing slurry including a silica sol that contains silica polishing particles to the wafer and the polishing pad, the silica polishing particles being surface modified with a surface charge modifier and having potassium ions attached to the silica polishing particles; and planarizing at least a portion of a surface of the wafer with the chemical mechanical polishing slurry.

In the third aspect of this invention, the method for preparing a chemical mechanical polishing slurry that can polish a copper layer without excessively or destructively polishing a barrier layer beneath the copper layer includes the steps of: decationizing a solution of a silicate through a cation exchanger to form silicic acid in the solution; and alkalizing the silicic acid with potassium hydroxide or potassium water glass to form silica polishing particles that have potassium ions attached thereto.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

According to the present invention, a silica sol is prepared by alkalizing silicic acid with potassium hydroxide or potassium water glass. While potassium hydroxide or potassium water glass is known to be usable as a base for alkalization, like sodium hydroxide or sodium water glass, in preparing a silica sol or colloidal silica, the prior art neither teaches nor suggests that potassium hydroxide or potassium water glass, when used as an agent for the alkalization of silicic acid, can provide a silica sol that is particularly suited for the removal of copper by chemical mechanical polishing. Conventionally, an aqueous solution of sodium hydroxide or sodium silicate is used as a base for the alkalization in consideration of safety, operating convenience, and production costs.

Surprisingly, the applicants have found that when the alkalization is conducted using potassium hydroxide or potassium water glass instead of sodium hydroxide or sodium silicate to form a silica sol, and when a chemical mechanical polishing slurry produced from the silica sol is used in a Cu CMP process, the slurry can remove a copper layer on a wafer efficiently without excessively or destructively polishing a barrier layer, such as a TaN layer, beneath the copper layer.

Figure 1:
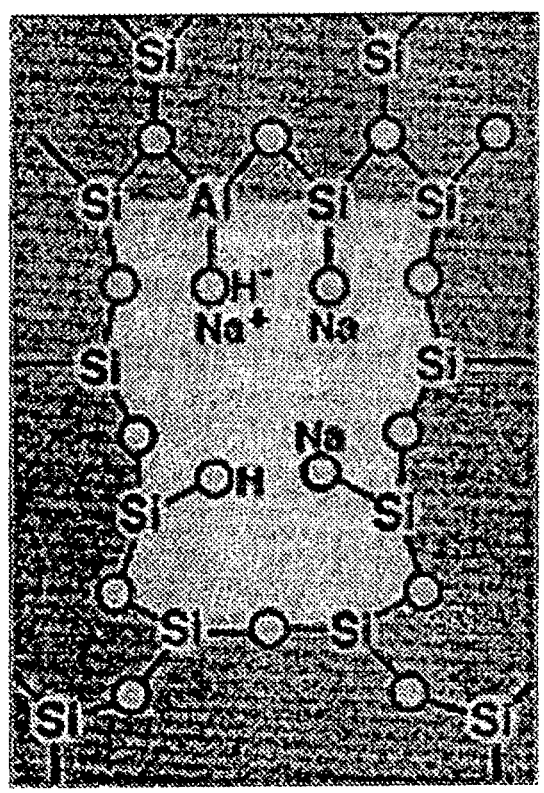
FIG. 1 is a schematic view illustrating a molecular structure of a conventional colloidal silica particle.

Referring to FIG. 1, a molecular structure of a conventional colloidal silica particle is illustrated. Without being bound by any theory, it is believed that the colloidal silica particles obtained by the alkalization using potassium hydroxide may have a structure similar to that shown in FIG. 1, except that $Na^+$ will be substituted by $K^+$ and that $H^+$ of the —OH group will be substituted by $K^+$ to form the —OK group. The $K^+$ of the —OK group will be subsequently dissociated out of the particles so as to form the colloidal silica particles bearing —$O^-$. That is, the colloidal silica particles formed by the alkalization using potassium hydroxide have potassium ions attached thereto and bear negative charges (i.e., —$O^-$).

As described above, the chemical mechanical polishing slurry of the present invention includes an acid, a surfactant, and a silica sol having silica polishing particles that are surface modified with a surface charge modifier and that have potassium ions attached thereto. Preferably, the potassium ions in the silica polishing particles are in an amount greater than 100 ppm, preferably greater than 200 ppm, based on a total weight of the silica polishing particles.

The method for preparing the chemical mechanical polishing slurry includes the steps of: decationizing a solution of a silicate through a cation exchanger to form silicic acid in the solution; alkalizing the silicic acid with potassium hydroxide or potassium water glass to form silica polishing particles that have potassium ions attached thereto; surface-modifying the silica polishing particles with a surface charge modifier; decationizing the solution through a cation exchanger so as to remove mobile cation from the solution after surface-modifying, thus forming a silica sol; and adding an acid and an surfactant to the silica sol so as to obtain the chemical mechanical polishing slurry.

The surface charge modifier suitable for this invention is well known in the art. Preferably, the surface charge modifier is a metal oxide which has a valence number greater than +3 and which is aluminum, chromium, gallium, titanium, zirconium, or combinations thereof. More preferably, the surface charge modifier is an aluminate. Most preferably, the surface charge modifier is sodium aluminate or potassium aluminate.

The chemical mechanical polishing slurry of the present invention provides an acidic environment for the silica polishing particles. The pH value of the chemical mechanical polishing slurry of the present invention ranges preferably from 2 to 5, more preferably from 3 to 4. The silica polishing particles after the surface modification with the surface charge modifier can be maintained stably and suitably in the acidic environment.

The acid contained in the chemical mechanical polishing slurry of the present invention is used for corroding the copper layer of the wafer. Preferably, the acids suitable for the present invention are malonic acid, succinic acid, pentanedioic acid, hexanedioic acid, itaconic acid, trans-butenedioic acid, acrylic acid, 2-hydroxy-acetic acid, formic acid, acetic acid, hexanoic acid, lactic acid, malic acid, tartaric acid, gluconic acid, citric acid, hydrochloric acid, sulfuric acid, cis-butenedioic acid, trans-butenedioic acid, 2,2-dimethyl-succinic acid, 2-ethyl-2-methyl-succinic acid, 2,3-dimethyl-succinic acid, itaconic acid, 2-methyl-cis-butenedioic acid, 2-methyl-trans-butenedioic acid, 2-methyl-2-hydroxy-acetic acid, 2-ethyl-2-hydroxy-acetic acid, 2,2-diethyl-2-hydroxy-acetic acid, 2-ethyl-2-methyl-2-hydroxy-acetic acid, 2-methyl-acrylic acid, 2-ethyl-acrylic acid, 3-methyl-acrylic acid, 2,3-dimethyl-acrylic acid, 1,2,3,4-butane tetracarboxylic acid, or combinations thereof. Preferable acids are succinic acid, pentanedioic acid, hexanedioic acid, itaconic acid, trans-butenedioic acid, acrylic acid, 2-hydroxy-acetic acid, formic acid, 1,2,3,4-butane tetracarboxylic acid, or combinations thereof. The amount of the acid preferably ranges from 0.01 to 5 wt. %, more preferably ranging from 0.1 to 3 wt. %, based on the total weight of the chemical mechanical polishing slurry.

The surfactant suitable for this invention is an anionic surfactant or a nonionic surfactant. Preferably, the surfactant is an anionic surfactant. Preferably, the surfactant is used in the chemical mechanical polishing slurry in an amount ranging from 0.01 to 1 wt % based on the total weight of the chemical mechanical polishing slurry.

Furthermore, additives commonly used in the art can be added into the chemical mechanical polishing slurry of the present invention, if necessary. The additives suitable for the chemical mechanical polishing slurry of the present invention include a biocide, a corrosion inhibitor, an oxidant, a stabilizer, or the like. The additives can be used alone or in combination.

Suitable corrosion inhibitors are benzotriazole, tricyanic acid, 1,2,3-triazole, 3-amino-1,2,4-triazole, 3-nitro-1,2,4-triazole, 4-amino-3-hydrazino-1,2,4-triazoyl-5-thiol, benzotriazole-5-carboxylic acid, 3-amino-1,2,4-triazole-5-carboxylic acid, 1-hydro-benzotriazole, nitro-benzotriazole, or the like, or any combinations thereof. Preferably, the corrosion inhibitor is benzotriazole.

Suitable oxidants are hydrogen peroxide, ferric nitrate, potassium iodate, peracetic acid, potassium permanganate, or the like, or any combinations thereof. Preferably, the oxidant is hydrogen peroxide.

The amount of the additive added to the chemical mechanical polishing slurry of the present invention may be determined according to the conditions or results of polishing the wafer. For example, if the level of dishing occurring at the edge of the wafer is high, it can be lowered by increasing the amount of the surfactant. Additionally, if the polishing rate of the wafer is lower than 3000 Å/min, it can be raised by increasing the amount of the acid component and/or the amount of the silica polishing particles.

The present invention also provides a chemical mechanical polishing method, which includes the steps of: (a) contacting a wafer with a polishing pad; (b) supplying the chemical mechanical polishing slurry of the present invention to the wafer and the polishing pad; and (c) planarizing at least a portion of a surface of the wafer with the chemical mechanical polishing composition.

The following examples are provided to illustrate the preferred embodiments of the invention, and should not be construed as limiting the scope of the invention.

The following examples and comparative examples were carried out at room temperature and at ambient pressure unless otherwise stated.

Examples 1-4

Preparation of Chemical Mechanical Polishing Slurry 300 ml of sodium water glass was mixed with 2700 ml of de-ionized water to form an aqueous solution of sodium silicate, which was passed through a cationic exchange resin column, thereby forming silicic acid. 5 wt % aqueous KOH was added gradually at a temperature below 80° C. (preferably, 70-80° C.) until the pH value of the aqueous solution was greater than 10 so that the silicic acid was alkalized and underwent polycondensation. The reaction product was cooled to 40° C., and was added with 300 ml of 10 wt % sodium aluminate aqueous solution. After 40 minutes, the reaction product was passed through a cationic exchange resin column to obtain a clear silica sol A.

The silica sol A includes a plurality of silica polishing particles that were surface modified with sodium aluminate and that have potassium ions attached thereto. The particle size of the silica polishing particles determined by Malvern HPPS particle size analyzer of TREKINTAL CO. was about 10-50 nm.

The silica sol A was mixed with hexanedioic acid, an anionic surfactant, benzotriazole, and hydrogen peroxide in the amounts shown in Table 1 to obtain chemical mechanical polishing slurries.

Comparative Examples 1-3

Preparation of Chemical Mechanical Polishing Slurry

A silica sol B was prepared in a manner substantially similar to that for the silica sol A except that the alkalization was conducted using 5 wt % aqueous NaOH. The silica sol B includes a plurality of silica polishing particles that were surface modified with sodium aluminate and that have sodium ions attached thereto.

The silica sol B was mixed with hexanedioic acid, an anionic surfactant, benzotriazole, and hydrogen peroxide in the amounts shown in Table 1 to obtain chemical mechanical polishing slurries.

Tests

I. Determination of the Potassium Content

The potassium content in the silica polishing particles was determined by a microwave-assisted acid digestion method. 0.1 g of silica polishing particles were mixed with 10 ml of concentrated hydrofluoric acid to form a mixture. The mixture was added into a microwave digestion equipment (manufactured by Perkin Elmer Co., Model No. 2000), and was reacted to obtain a suspension. After the suspension was removed from the equipment, the potassium content of a portion of the suspension was detected using an inductive coupling plasma spectrometer (manufactured by Agilent Co., Model No. 7500C).

II. Polishing Test

1. Testing Conditions (1) Instruments/Devices: (a) Polishing machine: manufactured by Applied Materials, Inc., Model No. AMAT/Mirra; (b) Polishing Pad manufactured by Rohm & Haas, Model No. CUP4410; (c) Blank Cu wafer: manufactured by Semiconductor Manufacturing International Corp., China, having a thickness of 20,000 Å; (d) Blank TaN wafer: manufactured by Semiconductor Manufacturing International Corp., China, having a thickness of 3,000 Å; (e) Cu Patterned wafer: a wafer plated with a Cu patterned layer on a barrier layer of TaN, manufactured by Sematech, U.S.A., wire width of 0.18 μm.

(2) Instrument Settings: membrane pressure: 1.0-1.5 psi; initial pressure: 1.5-2.0 psi; down force pressure: 1.2-1.5 psi; inner tube: vent; retaining ring pressure: 1.8 psi; platen speed: 70 rpm; carrier speed: 74 rpm; temperature: 25° C.; slurry flow rate: 200 ml/min.

2. Testing Procedure

The blank Cu wafer, the blank TaN wafer, and the Cu patterned wafer were polished by the polishing machine using the chemical mechanical polishing slurries of the examples and the comparative examples. The wafers were polished initially at the initial pressure for 10 seconds, followed by polishing at the down force pressure. The wafers after the polishing procedure were washed by a washing device (Evergreen Model 10× manufactured by Solid State Equipment Corp.), and were dried by nitrogen purging before conducting the following evaluation.

3. Evaluation (1) Polishing Rate: The blank Cu wafer and the blank TaN wafer before and after the polishing procedure were tested using a resistivity measurement system (manufactured by KLA-TENCOR, U.S.A., Model No. KLA-Tencor RS-75) to measure the removed thicknesses of the Cu layer of the blank Cu wafer and of the TaN layer of the blank TaN wafer. The polishing rate is defined as the thickness removed within 1 minute, and is expressed in terms of Å/min. In the first step of the Cu CMP process, the commercially acceptable range for the polishing rate of the Cu layer is preferably above 3,000 Å/min. In general, the polishing rate of the TaN layer should be as low as possible.

(2) Dishing Level: The dishing level of an edge area of a wafer surface is measured by a contact surface profiler (manufactured by KLA-TENCOR, Model No. KLA-Tencor P-11). In general, the smaller the value, the better will be the dishing level.

Figure 2:
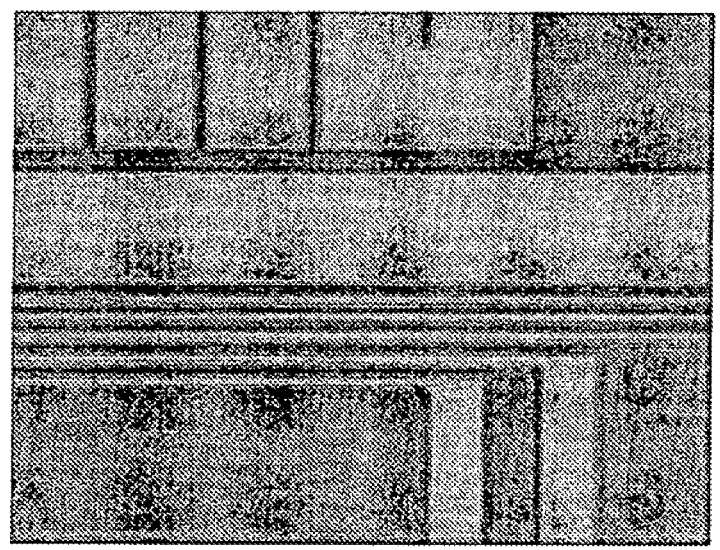
FIG. 2 is an optical microscope photograph of a surface of a wafer after being polished using a conventional chemical mechanical polishing slurry.
Figure 3:
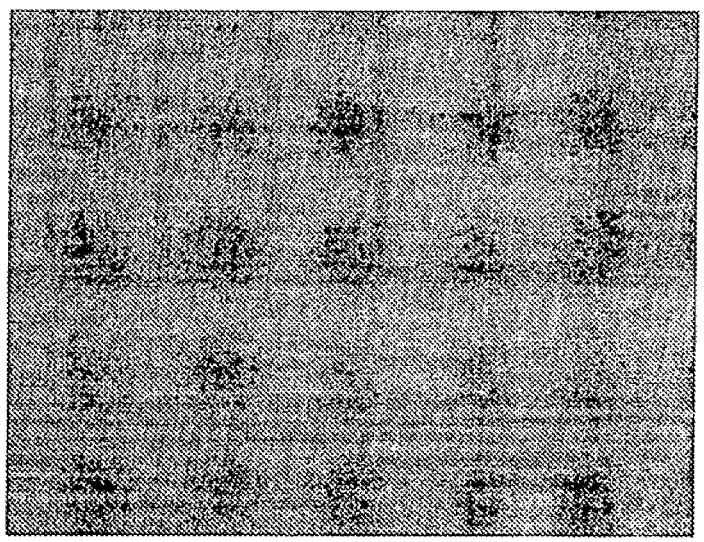
FIG. 3 is an optical microscope photograph of a surface of a wafer after being polished using a chemical mechanical polishing slurry of the present invention.

(3) Surface Observation of a Cu Patterned Wafer After Being Polished: The center, edge, and middle portions of the barrier layer of the Cu patterned wafer after being polished were observed by an optical microscope (manufactured by Olympus, Model No. MX50A/T, 1500×). Examples of microscope photography are shown in FIGS. 2 and 3. The black distinctive profile shown in FIG. 2 indicates that the barrier layer (such as the TaN layer) was polished away, thereby exposing dielectric layer (such as silica layer). Oppositely, the absence of the black profile in FIG. 3 indicates that the barrier layer was not polished away.

4. Results i. The Potassium Content: The potassium contents in the silica polishing particles determined by the microwave-assisted acid digestion method are 264 ppm for Examples 1 to 3, and 212.4 ppm for Example 4.

ii. Polishing Test: The results of the polishing tests using the chemical mechanical polishing slurries of Examples 1-4 and Comparative Examples are shown in Table 1, in which the concentrations or ratios of the components are determined on a weight basis. The term "Solid content" in Table 1 means the content of silica particles in each of the slurries. As for the surface observation of the Cu patterned wafers after being polished, the symbol "O" represents the absence of the contrasting black at the profile of the patterned components in the microscope photograph, that is to say, the TaN barrier layer was not overly polished and was not damaged. The symbol "X" represents the presence of the distinctive black at the profile in the microscope photograph, that is to say, the TaN barrier layer had substantial damage and was polished excessively. The symbol "Δ" represents slight damage to the TaN barrier layer.

TABLE I

| | | Ex. 1 | Ex. 2 | Ex. 3 | Ex. 4 | Comp. Ex. 1 | Comp. Ex. 2 | Comp. Ex. 3 |
|---|---|---|---|---|---|---|---|---|
| Silica Polishing Particles | | Surface modified with sodium aluminate and having potassium ions | | | | Surface modified with sodium aluminate and having potassium ions | | |
| | pH | 3.96 | 3.94 | 3.50 | 3.50 | 3.90 | 3.90 | 3.50 |
| Acid amount | Hexanedioic acid (%) | 0.4 | 0.4 | 0.4 | 0.4 | 0.4 | 0.4 | 0.4 |
| | Formic acid (%) | 0 | 0 | 0.1 | 0.1 | 0 | 0 | 0.1 |
| | Itaconic acid (%) | 0 | 0 | 0.2 | 0.2 | 0 | 0 | 0.2 |
| | 1,2,3,4-butane tetracarboxylic acid (%) | 0 | 0 | 0.025 | 0.025 | 0 | 0 | 0.025 |

TABLE I-continued

|  | Ex. 1 | Ex. 2 | Ex. 3 | Ex. 4 | Comp. Ex. 1 | Comp. Ex. 2 | Comp. Ex. 3 |
|---|---|---|---|---|---|---|---|
| Anionic surfactant (ppm) | 1500 | 1500 | 2000 | 2000 | 1500 | 1500 | 2000 |
| Solid content (%) | 1 | 2 | 3 | 3 | 1 | 2 | 3 |
| Benxotriazole (ppm) | 600 | 600 | 600 | 600 | 600 | 600 | 600 |
| Hydrogen peroxide (%) | 3 | 3 | 3 | 3 | 3 | 3 | 3 |
| Initial Pressure (psi) | 2.0 | 2.0 | 2.0 | 2.0 | 2.0 | 2.0 | 2.0 |
| Down Force Pressure (psi) | 1.5 | 1.5 | 1.5 | 1.5 | 1.5 | 1.5 | 1.5 |
| Cu polishing rate (Å/100 μm) | 5746 | 6270 | 6840 | 6740 | 5641 | 6319 | 6806 |
| TaN polishing rate (Å/100 μm) | 6 | 9 | 25 | 16 | 15 | 20 | 121 |
| Dishing level (Å/100 μm) | 874 | 1045 | 752 | 774 | 1387 | 2055 | 1541 |
| surface observation of the Cu patterned wafer after being polished — Center | ○ | Δ | ○ | ○ | x | x | x |
| surface observation of the Cu patterned wafer after being polished — Edge | ○ | Δ | ○ | ○ | x | x | x |
| surface observation of the Cu patterned wafer after being polished — Middle | ○ | Δ | ○ | ○ | x | x | x |

Comparison Between Example 1 and Comparative Example 1

As shown in Table 1, the Cu patterned wafer after being polished by the chemical mechanical polishing slurry of Example 1 had no damage to the TaN barrier layer at the center, middle, and edge portions thereof, which indicates that the TaN layer was not overly polished so that the $SiO_2$ layer beneath the TaN layer was not exposed, and that the chemical mechanical polishing slurry of Example 1 is useful for the first step of the Cu CMP process for Cu removal. On the other hand, the Cu patterned wafer after being polished by the chemical mechanical polishing slurry of Comparative Example 1 shows substantial damage to the TaN barrier layer at the center, middle; and edge portions thereof.

Additionally, while the Cu polishing rate of Example 1 is substantially equal to that of Comparative Example 1, the TaN polishing rate of Example 1 is merely about 40% of that of Comparative Example 1. The dishing level of Example 1 is only 63% of that of Comparative Example 1. This indicates that Example 1 is superior to Comparative Example 1.

Comparison Between Example 2 and Comparative Example 2

As shown in Table 1, in the Cu patterned wafer after being polished by the chemical mechanical polishing slurry of Example 2, merely slight damage appears in parts of the TaN barrier layer at the center, middle, and edge portions thereof. However, in the Cu patterned wafer after being polished by the chemical mechanical polishing slurry of Comparative Example 2, substantial damages appear in the TaN barrier layer at all of the center, middle, and edge portions thereof. Therefore, as compared to the chemical mechanical polishing slurry of Comparative Example 2, the chemical mechanical polishing slurry of Example 2 can avoid excessive polishing of the TaN layer.

Additionally, while the Cu polishing rate of Example 2 is substantially equal to that of Comparative Example 2, the TaN polishing rate of Example 2 is merely about 45% of that of Comparative Example 2. Moreover, the dishing level of Example 2 is only 51% of that of Comparative Example 2. This indicates that Example 2 is superior to Comparative Example 2.

Comparison Between Example 3 and Comparative Example 3

As shown in Table 1, the Cu patterned wafer after being polished by the chemical mechanical polishing slurry of Example 3 had no damage to the TaN barrier layer at the center, middle, and edge portions thereof, which indicates that the chemical mechanical polishing slurry of Example 3 is useful for the first step of the Cu CMP process for Cu removal oppositely, the Cu patterned wafer after being polished by the chemical mechanical polishing slurry of Comparative Example 3 had substantial damage to the TaN barrier layer at the center, middle, and edge portions thereof.

Additionally, while the Cu polishing rate of Example 3 is substantially equal to that of Comparative Example 3, the TaN polishing rate of Example 3 is merely about 21% of that of Comparative Example 3. Moreover, the dishing level of Example 1 is only 48.8% of that of Comparative Example 3.

In view of the aforesaid comparison results, the chemical mechanical polishing slurry of the present invention is advantageous for the first step of the Cu CMP process to remove Cu.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for preparing a chemical mechanical polishing slurry for polishing a copper layer without excessively or destructively polishing a barrier layer beneath the copper layer, comprising the steps of: (a) decationizing a solution of a silicate through a cation exchanger to form silicic acid in the solution; and (b) alkalizing the silicic acid with potassium hydroxide or potassium water glass to form silica polishing particles that have potassium ions attached thereto, wherein the step of alkalizing the silicic acid with potassium hydroxide or potassium water glass is done at a temperature below 80° C.

2. The method of claim 1, further comprising the steps of (a) surface-modifying the silica polishing particles with a surface charge modifier; and (b) decationizing the solution through a cation exchanger so as to remove mobile cation from the solution after surface-modifying, thus forming a silica sol.

3. The method of claim 1, wherein the silicate is sodium silicate.

4. The method of claim 1, wherein potassium hydroxide is added to the solution for alkalizing the silicic acid.

5. The method of claim 2, further comprising a step of adding an acid and a surfactant to the silica sol.

* * * * *